United States Patent

Ma et al.

[11] Patent Number: 6,154,050
[45] Date of Patent: Nov. 28, 2000

[54] INTERNAL TRISTATE BUS WITH ARBITRATION LOGIC

[75] Inventors: Benny Ma, Saratoga, Calif.; Clement Lee, Portland, Oreg.

[73] Assignee: Lattice Semiconductor Corporation, Hillsboro, Oreg.

[21] Appl. No.: 09/067,320

[22] Filed: Apr. 27, 1998

[51] Int. Cl.[7] .............................................. H03K 19/177
[52] U.S. Cl. ........................ 326/39; 326/86; 326/56; 326/38
[58] Field of Search .............................. 326/37–41, 56, 326/47, 86

[56] References Cited

U.S. PATENT DOCUMENTS

| | | | |
|---|---|---|---|
| 4,969,121 | 11/1990 | Chan et al. | 326/41 |
| 4,991,085 | 2/1991 | Pleva et al. | 326/41 |
| 5,742,179 | 4/1998 | Sasaki | 326/39 |
| 5,789,944 | 8/1998 | Choy et al. | 326/82 |
| 5,850,152 | 12/1998 | Cliff et al. | 326/40 |
| 5,894,228 | 4/1999 | Reddy et al. | 326/39 |
| 5,900,743 | 5/1999 | McClintock et al. | 326/41 |
| 5,942,913 | 8/1999 | Young et al. | 326/41 |

*Primary Examiner*—Michael Tokar
*Assistant Examiner*—Don Phu Le
*Attorney, Agent, or Firm*—Philip W. Woo, Esq.; Skjerven Morrill et al.

[57] ABSTRACT

A programmable logic device having an internal tristate bus is provided. The internal tristate bus may be driven by a plurality of driving elements. Such a tristate bus, and the circuitry for supporting it, can be implemented on less surface area than the multitude of unidirectional buses, and supporting circuitry, which would otherwise be required for the same plurality of driving elements. Accordingly, the amount of surface area that is required to move information within a programmable logic device is reduced. Furthermore, in one embodiment, a arbitration logic circuit is provided for each driving element. These arbitration logic circuits cooperate to prevent the different elements from simultaneously driving the internal tristate bus. Accordingly, the integrity of the information on such bus is maintained.

17 Claims, 4 Drawing Sheets

6,154,050

INTERNAL TRISTATE BUS WITH ARBITRATION LOGIC

TECHNICAL FIELD OF THE INVENTION

The present invention relates generally to semiconductor integrated circuits, and more particularly, to an internal tristate bus with arbitration logic.

BACKGROUND OF THE INVENTION

A programmable logic device (PLD) is a standard product which can be purchased by systems manufacturers in a "blank" state and, thereafter, custom-configured into a virtually unlimited number of specific logic functions by programming the device with electrical signals. In these programmable logic devices, logic signals are routed between various elements, such as input/output (I/O) pads and logic arrays, during operation. According to previously developed techniques, a number of uni-directional buses are used to perform this routing. Each of these uni-directional buses is supported by its own respective wires, multiplexers, and drivers. Despite the numerous supporting circuit elements, however, each uni-directional bus can only be driven by a single element—i.e., only one element can place signals onto a particular bus. Thus, even for programmable logic devices having a relatively small number of elements, the surface area required to implement the necessary routing circuitry according to previous techniques can be significant.

In addition to problems of surface area, programmable logic devices implemented according to previously developed techniques also experience problems with performance. For example, in these logic devices, a signal may require multiple sources, each driven by a single element. A multiplexer must be implemented to select from one of these different sources. Additional delay is created by these multiplexers. Accordingly, the performance of these programmable logic devices suffers.

SUMMARY

The disadvantages and problems associated with previously developed programmable logic devices have been substantially reduced or eliminated using the present invention.

In accordance with one embodiment of the present invention, a programmable logic device includes an internal tristate bus. A plurality of driving elements are coupled to the internal tristate bus. Each driving element is operable to drive the internal tristate bus.

In accordance with another embodiment of the present invention, a programmable logic device comprises an internal tristate bus. An arbitration logic circuit, coupled to the internal tristate bus, prevents contention on the internal tristate bus.

Important technical advantages of the present invention include providing an internal tristate bus on a programmable logic device for routing information throughout. The internal tristate bus may be driven by a plurality of driving elements. Such a tristate bus, and the circuitry for supporting it, can be implemented on less surface area than the multitude of unidirectional buses, and supporting circuitry, which would otherwise be required for the same plurality of driving elements. Accordingly, the present invention reduces the amount of surface area that is required to move information within a programmable logic device.

Another technical advantage of the present invention includes providing an arbitration logic circuit for each element which is capable of driving an internal tristate bus. These arbitration logic circuits cooperate to prevent the different elements from simultaneously driving the internal tristate bus. To accomplish this, each arbitration logic circuit is capable of detecting and pulling down a flag signal. Whenever one element is driving the internal tristate bus, the arbitration logic circuit for that element pulls down the flag signal, which is then detected by the other arbitration logic circuits. A pulled-down flag signal alerts the other arbitration logic circuits that the internal tristate bus is currently being driven, thereby preventing the other elements from driving the bus at the same time. Accordingly, the integrity of the information on such bus is maintained.

Yet another important technical advantage includes providing circuitry for rapidly pulling up the voltage value of the flag signal, thereby relinquishing the internal tristate bus. This circuitry includes a fast pull-up circuit cooperating with a slow pull-up circuit. The fast pull-up circuit operates to initially raise the voltage value of the flag signal at a very rapid rate. The fast pull-up circuit then turns off, and the slow pull-up circuit completes the operation. Accordingly, the present invention enhances performance by reducing the time required to relinquish the internal tristate bus so that it may be driven by another element.

Other important technical advantages are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

The preferred embodiments of the present invention and their advantages are best understood by referring to FIGS. 1, 2A, 2B, and 3 of the drawings. Like numerals are used for like and corresponding parts of the various drawings.

Figure 1:
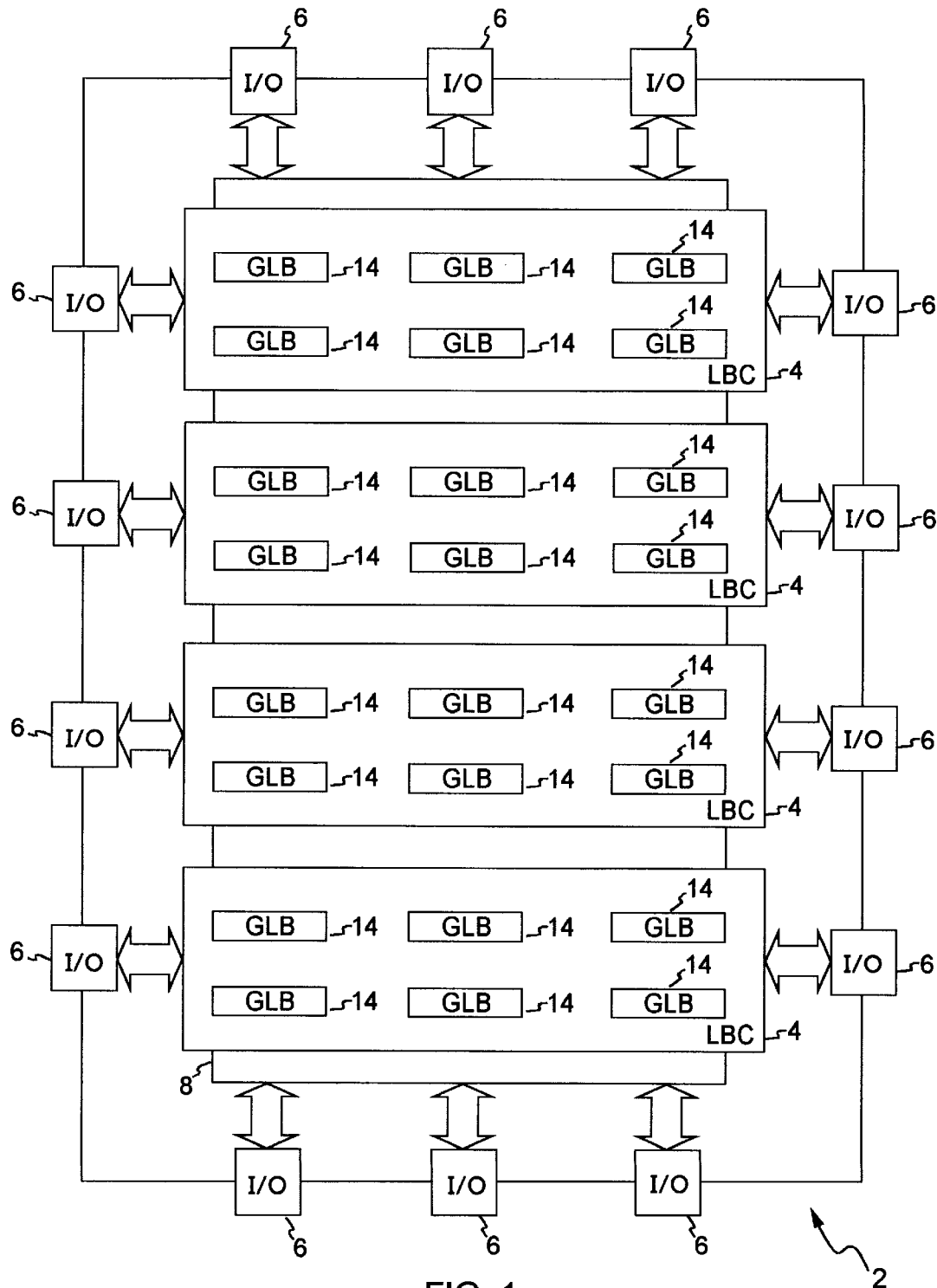
FIG. 1 illustrates an architecture for a programmable logic device in which the present invention can be incorporated.

FIG. 1 illustrates an exemplary architecture 2 for a programmable logic device in which the present invention can be incorporated. Architecture 2 includes a number of logic block clusters (LBCs) 4, each of which can perform various operations upon bits of information. Each logic block cluster 4 comprises a plurality of generic logic blocks (GLBs) 14, which are described below in more detail. A number of input/output (I/O) cells 6 allow information to be input into and output out of logic block clusters 4. A global routing plane 8 provides programmable communication lines for routing information signals into, out of, and/or throughout architecture 2, including between generic logic blocks 14 in the same or separate logic block clusters 4, and also I/O cells 6.

In accordance with the present invention, to perform at least a portion of this signal routing in the programmable logic device, at least one internal tristate bus may be provided in global routing plane 8 of architecture 2. As described herein, the use of an internal tristate bus enhances the performance of the programmable logic device, while simultaneously reducing the amount of surface area required to route signals throughout the logic device.

Figure 2A:
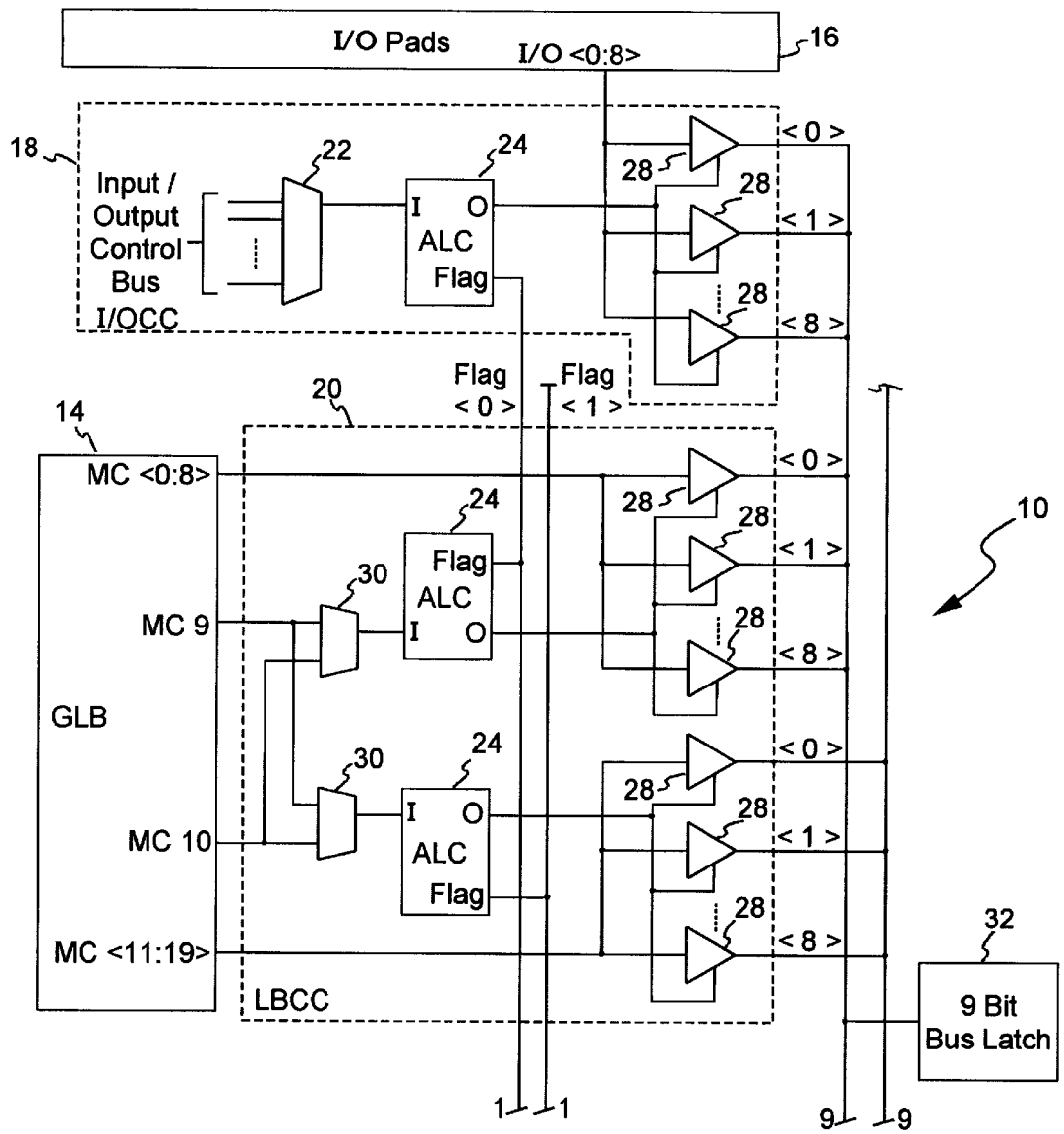
FIGS. 2A and 2B are a schematic diagram of an exemplary programmable logic device having an internal tristate bus, in accordance with the present invention.
Figure 2B:
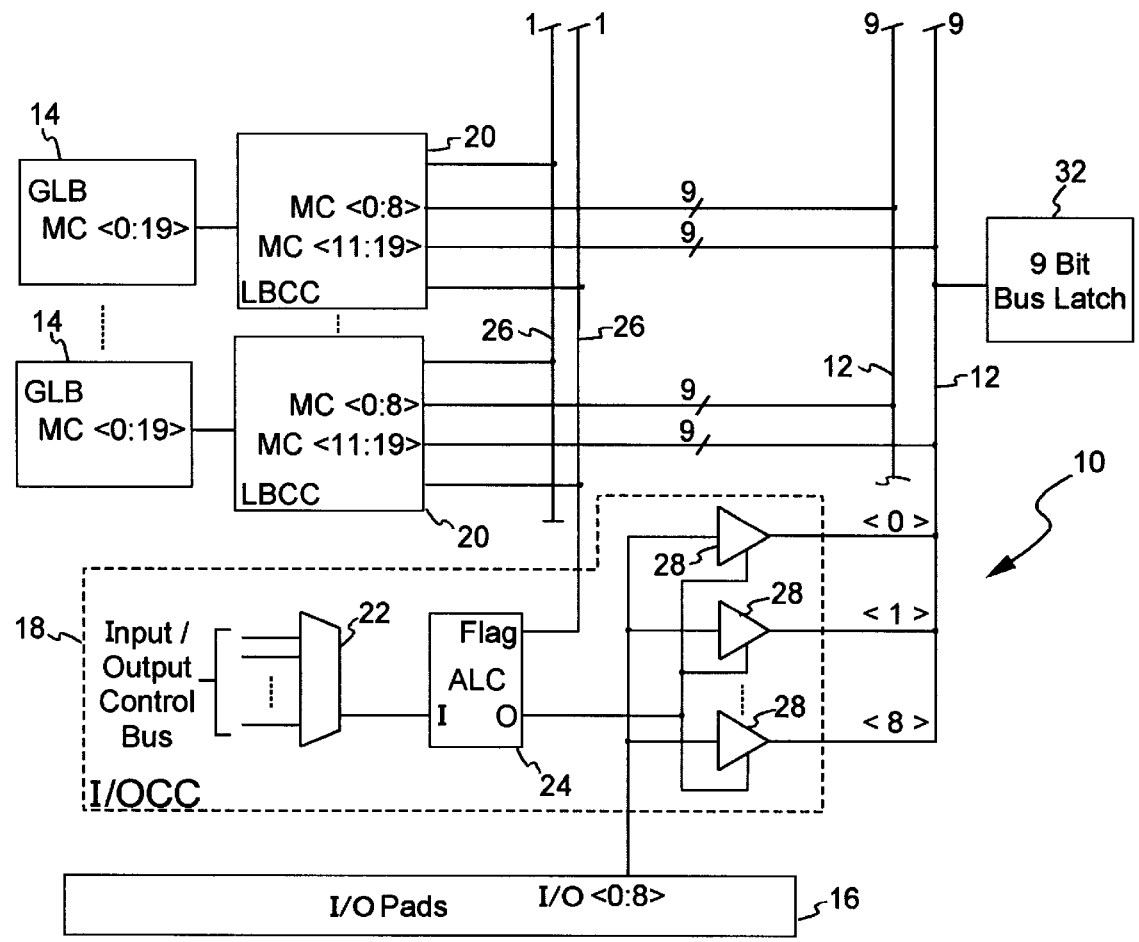

FIGS. 2A and 2B are a schematic diagram of an exemplary programmable logic device 10 having one or more internal tristate buses 12, in accordance with the present invention. Internal tristate buses 12 generally function as communication channels to move logic signals between various elements, such as generic logic blocks 14 and input/output (I/O) blocks 16, within programmable logic device 10. Each internal tristate bus 12 can be driven by a plurality of these elements, and thus, is essentially a shared data path that connects different parts of logic device 10. Furthermore, an internal tristate 12 can be extended to operate externally of logic device 10, for example, to move signals between or among several logic devices.

Each internal tristate bus 12 comprises a plurality of lines (not explicitly shown), wherein each bus line is operable to move one bit of information or data at a time. The number of lines within a bus defines its capacity or bus width (i.e., the number of bits that a bus can carry simultaneously). As shown, each of internal tristate buses 12 has a nine-bit bus width. It should be understood, however, that an internal tristate bus 12 generally can have any suitable bus width to accommodate the requirements of the programmable logic device within which it is located.

At any given moment of operation, each line of an internal bus 12 may be set in one of three states: (1) driven-high; (2) driven-low; and (3) not-driven, with previous data latched. In the driven-high state, the voltage on a bus line is driven or being pulled (by a driving element) to a high level representing a binary value of "1." In the driven-low state, the voltage on the line is driven or being pulled to a low level representing a binary value of "0." In the not-driven state, the voltage on the bus line is neither driven high nor driven low, but the previously driven values are retained, for example, in a bus latch. Hence, internal buses 12 are considered to be "tristate" buses.

The different states for each line in an internal tristate bus 12 are induced by signals output by various driving elements in programmable logic device 10. A driving element can be any element which stores, generates, forwards, or otherwise presents information that can be placed or "driven" onto an internal tristate bus 12 for movement to some other element within, or altogether out of, programmable logic device 10. Exemplary driving elements include generic logic blocks 14 and I/O blocks 16.

In general, each generic logic block 14 may perform any one or a combination of various operations upon bits of information received, stored, or generated within programmable logic device 10. Specifically, generic logic blocks 14 each comprise one or more macrocells (not explicitly shown) for operating upon data or other information. According to one embodiment, a generic logic block may include twenty macrocells. Each of these macrocells outputs a signal for a single bit of information. Some of the output signals may represent data whereas other output signals are used for control purposes. As further described herein, the output signals of the first nine macrocells, MC<0:8>, and the last nine macrocells, MC<11:19>, represent data. The output signals of the intermediate macrocells, MC9 and MC10, are used for control.

A separate I/O block 16 can be provided for each internal tristate bus. I/O blocks 16 support the input and output of information from programmable logic device 10. Each I/O block 16 may comprise one or more I/O pads (see FIG. 1) through which signals can be passed. In one embodiment, nine I/O pads are provided in each I/O block 16. Each of these pads may support a single bit of information. In FIGS. 2A and 2B, the signals for the nine I/O pads are designated as "I/O<0:8>".

Various circuitry which support each of internal tristate buses 12 is connected to the respective bus 12 and the elements which drive it. As used herein, the terms "connected," "coupled," or any variant thereof, means any connection or coupling, either direct or indirect, between two or more elements. Exemplary support circuitry includes a separate input/output control circuit (I/OCC) 18 for each internal tristate bus 12 and a plurality of element logic block control circuits (LBCC) 20.

Each I/O control circuit 18 is coupled between a corresponding I/O block 16 and internal tristate bus 12. I/O control circuits 18 each function to control the driving of the corresponding internal tristate bus 12 by the respective I/O block 16. In other words, an I/O control circuit 18 controls the movement of information from an I/O block 16 onto an internal tristate bus 12. As shown, each I/O control circuit 18 comprises a multiplexer 22, an arbitration logic circuit (ALC) 24, and a set of drivers 28. Multiplexer 22 receives a plurality of I/O control bus signals as inputs, and generates an output signal in response. Arbitration logic circuit 24 is connected to, and receives the output of, multiplexer 22. Generally, arbitration logic circuit 24 functions to prevent multiple elements in programmable logic device 10 from simultaneously driving an internal tristate bus 12. In this sense, arbitration logic circuit 24 "arbitrates" the signals on the internal tristate bus 12. This arbitration of a bus 12 is described below in more detail. Arbitration logic circuit 24 is connected to a flag line 26, which is a one-bit, bi-directional line over which a flag signal can be both modified and detected by the same circuit. The flag signal is a binary signal used to indicate whether an internal tristate bus 12 is currently being driven. A separate flag line 26 is provided for each internal tristate bus 12. Each driver 28 is connected between corresponding I/O block 16 and internal bus 12. A separate driver 28 is provided for each signal I/O<0:8> from I/O block 16; accordingly, in one embodiment, I/O control circuit 18 comprises nine drivers 28. Each driver 28 is also coupled to, and enabled by, arbitration logic circuit 24. When enabled, the drivers 28 drive the signals I/O<0:8> from the I/O block 16 onto internal tristate bus 12. It should be understood that I/O control circuit 18 can be bidirectional, and thus, may also include additional drivers (not explicitly shown) which are operable to drive signals from internal tristate bus 12 into the corresponding I/O block 16.

Each logic block control circuit 20 is coupled to a corresponding generic logic block 14 and both internal tristate buses 12. Logic block control circuits 20 each generally function to control the driving of information from the corresponding generic logic block 14 onto one of internal tristate buses 12. As shown, each logic block control circuit 20 comprises a plurality of multiplexers 30, arbitration logic circuits 24, and sets of drivers 28. In particular, a separate multiplexer 30, arbitration logic circuit 24, and set of drivers 28 is provided for each set of data signals MC<0:8> and MC<11:19>. Each multiplexer 30 receives, as input, control signals MC9 and MC10 from the corresponding generic logic block 14. Each arbitration logic circuit 24 is connected to a respective multiplexer 30 and receives as input a signal generated by that multiplexer 30. Each arbitration logic circuit 24 is coupled to one flag line 26 over which it may modify and/or detect a flag signal. Each set of drivers 28 is coupled to the respective arbitration logic circuit 24, and also connected between the corresponding generic logic block 14 and one internal tristate bus 12. A signal output by each arbitration logic circuit 24 serves to enable all drivers 28 in the respective set. Within each set, a separate driver 28 may be provided for each of the respective information signals output by generic logic block 14. Thus, in one embodiment, nine drivers 28 are provided for MC<0:8>, and another nine drivers 28 are provided for MC<11:19>. It should be understood that each logic block control circuit 20 can be bi-directional, and thus, may also include additional drivers (not explicitly shown) which are operable to drive signals from internal tristate buses 12 into the corresponding generic logic block 14. The arbitration logic circuits and drivers within each logic block control circuit 20 can be substantially the same as those within each I/O control circuit 18.

A separate bus latch 32 is coupled to each internal tristate bus 12. Each bus latch 32 functions to store or hold information previously driven onto the corresponding bus 12.

In operation, internal tristate buses 12 are used to move information, such as data or control, throughout programmable logic device 10. In particular, each internal tristate bus 12 may be driven by signals from any of a plurality of driving elements, including an I/O block 16 and one or more generic logic blocks 14.

Control circuitry, such as I/O control circuitry 18 or logic block control circuitry 20, allow or enable a respective driving element to drive each internal tristate bus 12. Specifically, for an I/O block 16, I/O control bus signals are input at multiplexer 22 of the corresponding I/O control circuit 18. Multiplexer 22 outputs an enable signal which is fed into arbitration logic circuit 24. If the signal appearing on the respective flag line 26 is set to an appropriate value, thus indicating that no other element is driving the respective internal tristate bus 12, arbitration logic circuit 24 passes the enable signal. This signal enables each driver 28 to which the arbitration logic circuit 24 is coupled. When the drivers 28 are enabled, the signals I/O<0:8> from the corresponding I/O block 16 are driven onto the respective internal tristate bus 12.

Similarly, in order for a generic logic block 14 to drive one of the internal tristate buses 12, control signals MC9 and MC10 are input into each of multiplexers 30 of the corresponding logic block control circuit 20. If either set of data signals MC<0:8> or MC<11:19> from generic logic block 14 are to be used to drive a bus 12, the respective multiplexer 30 outputs an enable signal. The respective arbitration logic circuit 24 receives the signal from multiplexer 30, and if the signal appearing on the respective flag line 26 is set to an appropriate value, the arbitration logic circuit 24 passes the enable signal. Each driver 28 in the respective set is thus enabled, thereby driving the signals MC<0:8> or MC<11:19>from the corresponding generic logic block 14 onto the respective internal tristate bus 12.

Using a respective flag line 26, the I/O control circuit 18 and logic block control circuits 20 coupled to a particular internal tristate bus 12 cooperate to ensure that only one driving element drives that bus 12 at any given time, thereby preventing contention between different signals on the bus.

Figure 3:
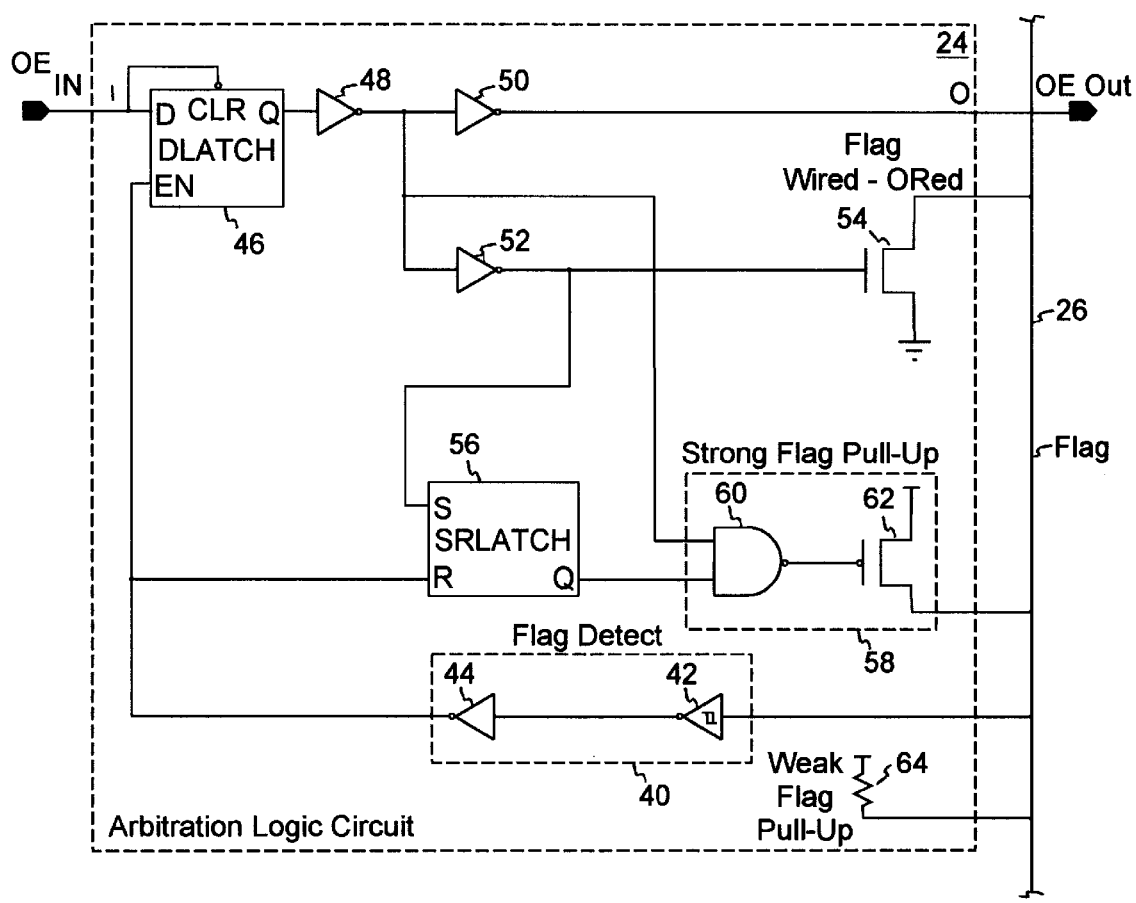
FIG. 3 is a schematic diagram of an exemplary arbitration logic circuit, in accordance with the present invention.

FIG. 3 is a schematic diagram of an exemplary embodiment for an arbitration logic circuit 24 shown in FIGS. 2A and 2B, in accordance with the present invention. Arbitration logic circuit 24 has an input "I" and an output "O." An output enable (IN) signal, labeled "$OE_{IN}$," is applied at input I of the arbitration logic circuit 24. The output enable signal is a binary signal, associated with a particular driving element, which generally indicates whether that driving element is currently presenting information for placement onto an internal tristate bus. In this regard, the output enable signal serves to "enable" the driving of the internal tristate bus by the associated driving element. Under certain circumstances, as described below, arbitration logic circuit 24 will pass the output enable signal as an output enable (OUT) signal, labeled "$OE_{OUT}$" and appearing at the "O" output. This $OE_{OUT}$ signal is connected to the enable input of each driver 28 in a respective set (see FIGS. 2A and 2B) for the arbitration logic circuit 24. In one embodiment, the drivers are enabled when the $OE_{OUT}$ signal is high, thereby allowing information to be placed onto the internal tristate bus; otherwise, the drivers are disabled.

Arbitration logic circuit 24 includes a flag detect circuit 40 which is connected to a flag line 26. Flag line 26 carries a binary signal indicating whether or not a respective internal tristate bus is currently being driven. In one embodiment, a high value for the flag signal indicates that no element is currently driving the bus, whereas a low value indicates that the some driving element is currently driving the bus. Flag detect circuit 40 includes a first inverter 42 and a second inverter 44 connected in series. First inverter 42 receives as its input the flag signal from flag line 26. As shown, first inverter 42 may comprise a Schmitt triggered inverter which filters noise in the flag signal. The Schmitt trigger inverter acts as a level detector which triggers second inverter 44 when the magnitude of the flag signal exceeds or falls below predetermined levels.

A D latch 46 is coupled to flag detect circuit 40. In particular, D latch 46 includes an enable (EN) input which receives the output from second inverter 44 of flag detect circuit 40. D latch 46 also includes a "D" input and a clear ($\overline{CLR}$) input, both of which receive the $OE_{IN}$ signal. D latch 46 generates an output signal which appears at a "Q" output of the latch.

An inverter 48 and an inverter 50 are connected in series to the Q output of D latch 46. The output of inverter 50 constitutes the $OE_{OUT}$ signal for arbitration logic circuit 24. An inverter 52 is also connected the output of inverter 48. The output of inverter 52 is connected to a flag wired-ORed circuit comprising an n-type transistor 54. N-type transistor 54 is coupled between flag line 26 and ground, and its gate is connected to inverter 52.

An SR latch 56 is connected to inverter 52 and flag detect circuit 40. In particular, an "S" input of SR latch 56 receives the output of inverter 52, and an "R" input of the latch receives the output from second inverter 44 of flag detect circuit 40. SR latch 56 generates an output signal which appears at a "Q" output.

A strong flag pull-up circuit 58 is connected to SR latch 56, inverter 48, and flag line 26. Strong flag pull-up circuit 58 includes a NAND gate 60 and a p-type transistor 62. At its inputs, NAND gate 60 receives the output of inverter 48 and the Q output of SR latch 56. The output of NAND gate 60 is connected to the gate of p-type transistor 62. The drain and source of p-type transistor 62 are coupled to a voltage source and flag line 26, respectively. A weak flag pull-up circuit comprising a resistor 64 or any weak p-channel pull-up (not shown) is also connected between the voltage source and flag line 26.

In operation, arbitration logic circuit 24 enables or disables the driving of signals onto an internal tristate bus, depending upon the value of the signal appearing on flag line 26. When the flag signal is high, flag detect circuit 40 (via the operation of first and second inverters 42 and 44) outputs a filtered high signal, which is then received at the enable input of D latch 46. The high value at the enable input allows the $OE_{IN}$ signal to pass freely from the D input of D latch 46 to the Q output. Via the operation of inverters 48 and 50, the signal value of $OE_{IN}$ is output as the value of $OE_{OUT}$.

Assuming that the $OE_{IN}$ signal is high, arbitration logic circuit 24 outputs a high $OE_{OUT}$ signal to enable the corresponding drivers. Inverter 48 outputs a low value in response to the high value of the $OE_{IN}$ signal. The low value output by inverter 48 is received at inverter 52 which, in turn, outputs a high value. This high value turns on n-type transistor 54 of the flag wired-ORed circuit, thereby pulling the value of the flag signal on flag line 26 to ground. The low value of the flag signal can be detected by the other arbitration logic circuits connected to the same flag line 26. In particular, with respect to such other arbitration logic circuits, the flag detect circuits contained therein output a low signal that is then received at the enable inputs of the corresponding D latches for those arbitration logic circuits. This prevents each of the D latches from passing signals from its D input to its Q output. Thus, no other arbitration logic circuits are allowed to enable the driving of the internal tristate bus.

Referring again to the arbitration logic circuit 24 which caused the low signal on flag line 26, flag detect circuit 40 also detects the low flag signal. In response, flag detect circuit 40 outputs a filtered low value which disables D latch 46, thereby latching the Q output at a high value. The low value output by flag detect circuit 40 is also received at the R input of SR latch 56. The S input of SR latch 56 receives a high value from inverter 52. This sets the Q output of SR latch 56 to a high value. NAND gate 60 in strong flag pull-up circuit 58 thus receives a high input from SR latch 56 and a low input from inverter 48. This causes NAND gate 60 to output a high value, which keeps p-type transistor 62 from turning on. Accordingly, strong flag pull-up circuit 58 is not allowed to pull the signal on flag line 26 high.

When driving has been completed, the $OE_{IN}$ signal received at D latch 46 goes low. This low value for $OE_{IN}$ clears D latch 46 at the $\overline{CLR}$ input so that the output at Q is low. In response to the low Q output of D latch 46, inverter 48 outputs a high value. Furthermore, the output of SR latch 56 remains set at a high value. Thus, NAND gate 60 of strong flag pull-up circuit 58 receives a high output from inverter 48 and a high output from SR latch 56. This causes NAND gate 60 to output a low value, which turns on p-type transistor 62. When p-type transistor 62 is turned on, the voltage source is connected to flag line 26, thereby pulling up the flag signal.

At some point during the pull up by strong flag pull-up circuit 58, flag detect circuit 40 will detect a high value on flag line 26. When this happens, flag detect circuit 40 outputs a high value which is received at the R input of SR latch 56. This high value resets the SR latch output to a low value. Because NAND gate 60 receives the low value at one of its inputs, NAND gate 60 outputs a high value. This high value turns off p-type transistor 62, thereby severing the connection between the voltage source and flag line 26. Accordingly, strong flag pull-up circuit 58 ceases to pull the flag signal high. However, the weak flag pull-up circuit, comprising resistor 64, pulls the signal on flag line 26 the rest of the way to a high value.

At the time flag detect circuit 40 for this arbitration logic circuit 24 detects a high value on flag line 26, the flag detect circuits for all other arbitration logic circuits connected to the same flag line also detect a high value. In turn, each of these other flag detect circuits outputs a high value which enables a respective D latch, thus allowing the corresponding driving elements to drive internal tristate bus 12.

From the above, it is clear that the present invention affords a number of technical advantages. For example, the present invention reduces the amount of surface area that is typically required to move or route information in a programmable logic device. Specifically, rather than providing a separate uni-directional bus for each driving element in the logic device, an internal tristate bus of the present invention can be driven by a plurality of elements. Such an internal tristate bus, taken together with the circuitry which supports it, requires less surface area to implement than the multitude of uni-directional buses, and supporting circuitry, which would otherwise be required for the same plurality of driving elements. Even for a programmable logic device having a relatively small number of driving elements, the savings in surface area can be substantial.

Furthermore, because the supporting control circuitry (e.g., I/O control circuits and logic block control circuits) prevents two or more elements from driving a particular internal tristate bus at the same time, the present invention maintains the integrity of the information on such bus. In addition, the life of the programmable logic device is extended because multiple elements are not allowed to pull a bus line in opposite voltage directions, which could result in the fusing of the line, or otherwise damaging the drivers.

Although the present invention and its advantages have been described in detail, it should be understood that various changes, substitutions, and alterations can be made therein without departing from the spirit and scope of the invention as defined by the appended claims.

What is claimed is:

1. A programmable logic device comprising:
   an internal tristate bus;
   a plurality of driving elements coupled to the internal tristate bus, each driving element operable to drive the internal tristate bus; and
   a plurality of arbitration logic circuits, with
   a separate arbitration logic circuit coupled to each of the plurality of driving elements, each arbitration logic circuit operable to determine whether the internal tristate bus is currently being driven, the arbitration logic circuits collectively operable to prevent contention of signals on the internal tristate bus.

2. The programmable logic device of claim 1, further comprising support circuitry coupled to the internal tristate bus and the plurality of driving elements.

3. The programmable logic device of claim 2, wherein the support circuitry comprises:
   a separate set of drivers for each driving element; and
   the separate arbitration logic circuits coupled to each set of drivers.

4. The programmable logic device of claim 1, further comprising a flag line associated with the internal tristate bus, the flag line operable to carry a flag signal indicating whether the internal tristate bus is currently being driven.

5. The programmable logic device of claim 1, wherein signals can be driven from the internal tristate bus into each driving element.

6. The programmable logic device of claim 5, wherein each arbitration logic circuit comprises a flag detect circuit for detecting the value of a flag signal, the flag signal indicating whether the internal tristate bus is currently being driven.

7. The programmable logic device of claim 6, wherein the flag detect circuit comprises a first inverter and a second inverter coupled in series to a flag line associated with the internal tristate bus.

8. The programmable logic device of claim 1, wherein each arbitration logic circuit comprises:

a strong flag pull-up circuit operable to initially raise the voltage value of a flag signal at a rapid rate, the strong flag pull-up operable to turn off at a predetermined level for the voltage value; and a weak flag pull-up circuit operable to further raise the voltage value of the flag signal after the strong flag pull-up circuit has turned off.

9. The programmable logic device of claim 1, wherein each arbitration logic circuit further comprises a flag wired-ORed circuit operable to pull down the voltage value of a flag signal.

10. The programmable logic device of claim 1, wherein the plurality of driving elements comprises:

an input/output (I/O) block; and a generic logic block.

11. A programmable logic device comprising:

an internal tristate bus; and a plurality of arbitration logic circuits coupled to the internal tristate bus, each arbitration logic circuit operable to determine whether the internal tristate bus is currently being driven, each arbitration logic circuit operable to prevent contention on the internal tristate bus.

12. The programmable logic device of claim 11, wherein each arbitration logic circuit further comprises a flag wired-ORed circuit operable to pull down the voltage value of a flag signal.

13. The programmable logic device of claim 11, wherein each arbitration logic circuit comprises a flag detect circuit for detecting the value of a flag signal, the flag signal indicating whether the internal tristate bus is currently being driven.

14. The programmable logic device of claim 13, wherein the flag detect circuit comprises a first inverter and a second inverter coupled in series to a flag line associated with the internal tristate bus.

15. The programmable logic device of claim 11, wherein each arbitration logic circuit comprises:

a strong flag pull-up circuit operable to initially raise the voltage value of a flag signal at a rapid rate, the strong flag pull-up operable to turn off at a predetermined level for the voltage value; and a weak flag pull-up circuit operable to further raise the voltage value of the flag signal after the strong flag pull-up circuit has turned off.

16. The programmable logic device of claim 11, further comprising a set of drivers coupled to the internal tristate bus, each driver having an enable input coupled to the arbitration circuit.

17. The programmable logic device of claim 16, wherein each arbitration logic circuit further comprises a D latch operable to pass an enable signal to the set of drivers.

* * * * *